United States Patent [19]
Briggs et al.

[11] Patent Number: 6,002,266
[45] Date of Patent: *Dec. 14, 1999

[54] SOCKET INCLUDING CENTRALLY DISTRIBUTED TEST TIPS FOR TESTING UNPACKAGED SINGULATED DIE

[75] Inventors: Merton Darrell Briggs, Chelmsford; Alfred H. Miller, Sudbury, both of Mass.

[73] Assignee: Digital Equipment Corporation, Maynard, Mass.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/448,290

[22] Filed: May 23, 1995

[51] Int. Cl.⁶ ............................ G01R 31/02; G01R 31/26
[52] U.S. Cl. ........................ 324/758; 324/765; 324/755
[58] Field of Search ................................. 324/755, 758, 324/765; 439/70, 71, 525, 526

[56] References Cited

U.S. PATENT DOCUMENTS

| | | | |
|---|---|---|---|
| 4,766,371 | 8/1988 | Moriya | 324/763 |
| 5,172,050 | 12/1992 | Swapp | 324/762 |
| 5,177,439 | 1/1993 | Liu et al. | 324/754 |
| 5,302,891 | 4/1994 | Wood et al. | 324/765 |
| 5,323,035 | 6/1994 | Leedy | 257/248 |
| 5,402,077 | 3/1995 | Agahdel et al. | 324/758 |
| 5,414,370 | 5/1995 | Hashinaga et al. | 324/760 |
| 5,519,332 | 5/1996 | Wood et al. | 324/755 |
| 5,530,376 | 6/1996 | Lim et al. | 324/765 |

*Primary Examiner*—Josie Ballato
*Assistant Examiner*—Russell M. Kobert
*Attorney, Agent, or Firm*—Hamilton, Brook, Smith & Reynolds, P.C.

[57] ABSTRACT

A singulated die test socket is presented. The socket allows for die to be fully functional tested and thermal tested before packaging. The socket is created from similar silicon material as the die being tested thereby producing a match of thermal coefficients of expansion between the socket and the die. It is also possible to provide additional circuitry in the socket to aid in the testing of the die. The test socket may also be used as an integrated circuit package by adding a lid, used to seal the die within the package cavity. In both uses the socket cavity may be created with sloping sidewalls, the sloping sidewalls providing for self alignment of the die within socket cavity.

3 Claims, 9 Drawing Sheets

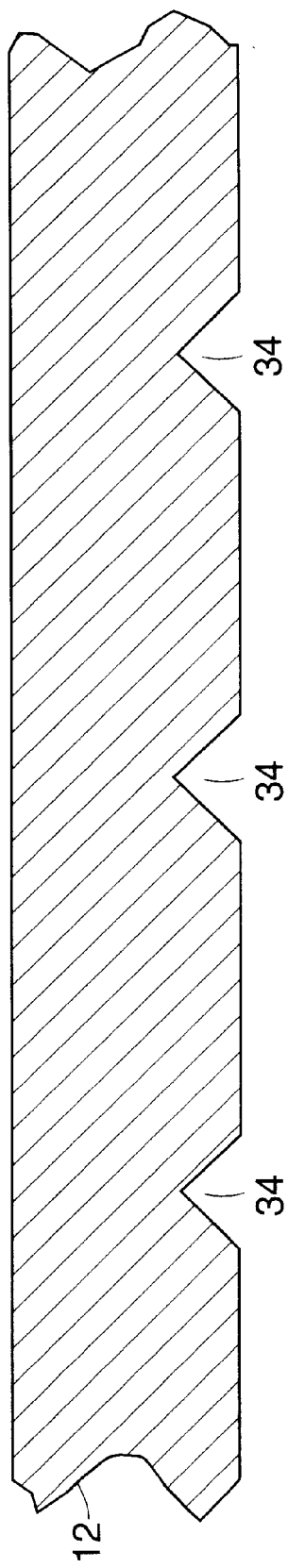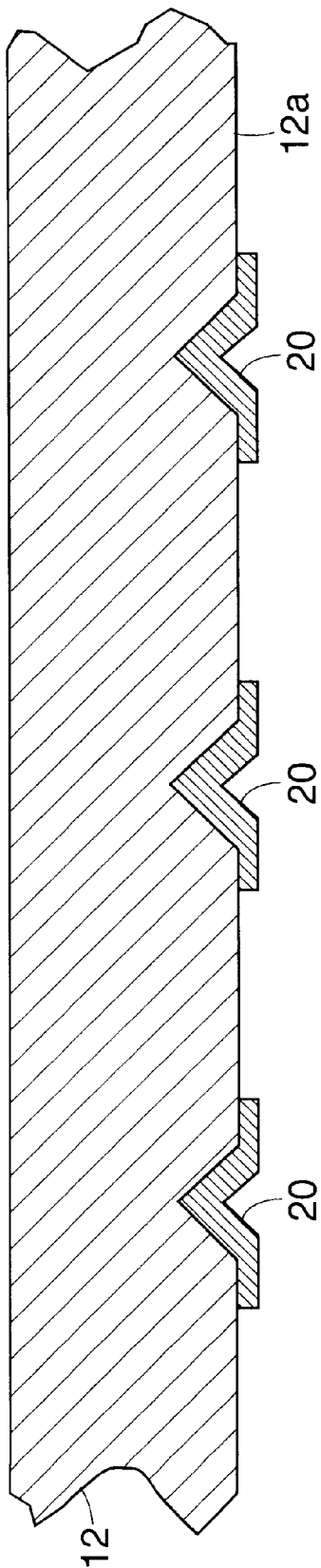

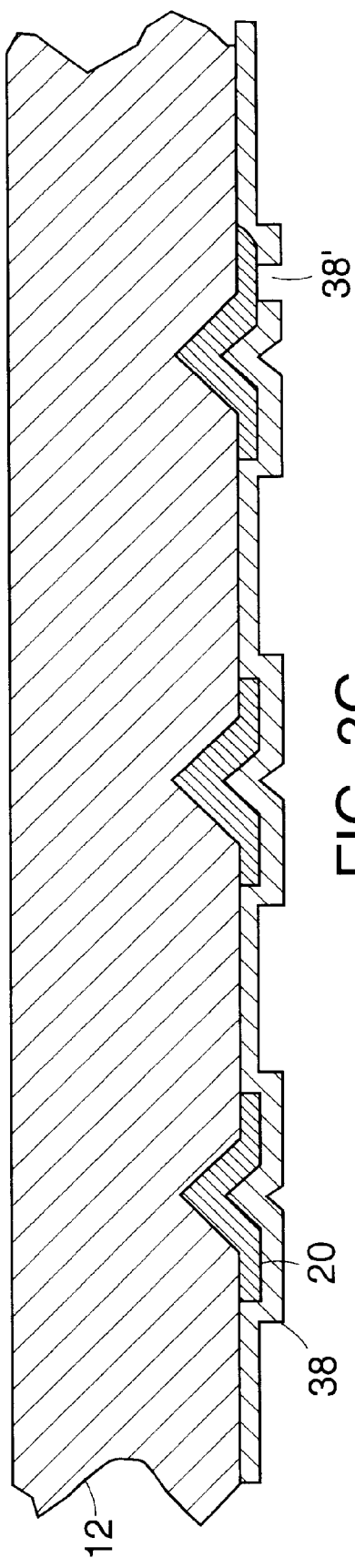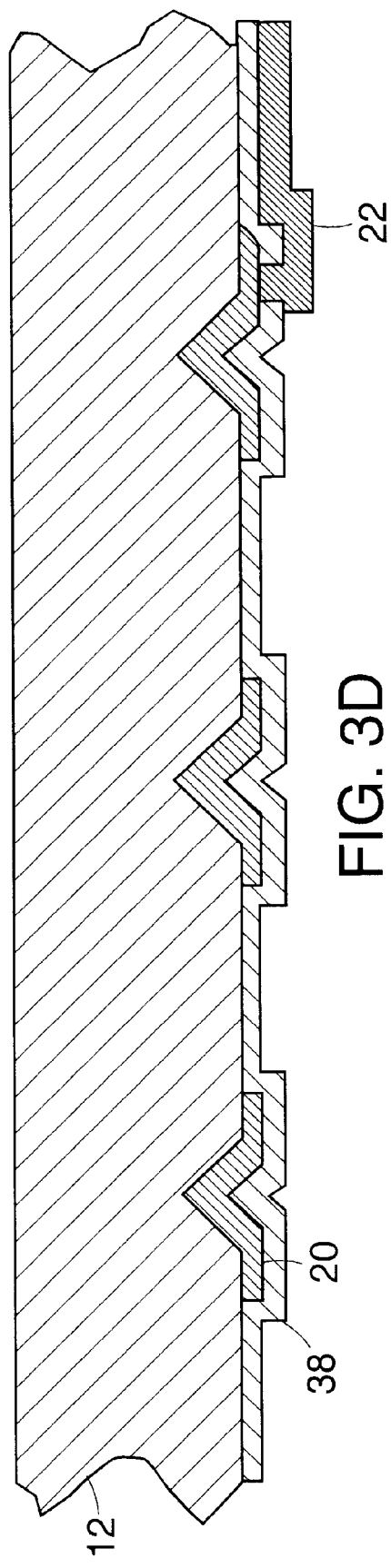

SOCKET INCLUDING CENTRALLY DISTRIBUTED TEST TIPS FOR TESTING UNPACKAGED SINGULATED DIE

BACKGROUND

This invention relates generally to test sockets and more specifically to test sockets for Very Large Scale Integrated (VLSI) circuits. As it is known in the art, once a wafer of semiconductor devices has been manufactured it is generally desirable to test individual die before dicing and sawing. In this manner the failing die can be identified and discarded while the passing die are packaged then subjected to more stringent testing. One technique used to test the die at the wafer level is to use either wire probe cards or a polyimid based membrane attached to an aluminum substrate to interconnect the I/O pads of the die to a device tester so that the die can be exercised to determine if the die are functional.

Typical semiconductor manufacturing processes call for the die to undergo a low level functional test while still at the wafer level. The wafer is cut to produce the individual (singulated) die, with the failures from the low level functional test discarded. The die which have passed the low level functional test are packaged and subjected to vigorous functionality and burn-in testing to insure the die are fully functional across their operating temperature and voltage range. This process suffers from several drawbacks among them being the amount of time consumed, failing to provide for the most efficient use of very expensive tester resources, lost value by the packaging of some die which pass the first limited functionality test but fail the more vigorous testing, and delays in the transmission of test results to the wafer fabrication process which serves to impede yield improvement efforts.

Additionally as the circuitry of the die becomes more complex and more dense the number of I/O pads on the die also increases. In order to minimize die size and maximize the number of I/O pads the distance between the I/O pads (pitch) must shrink and the peripheral array I/O pads are supplemented by I/O pads distributed within the central portion of the die (area array). Techniques for testing and burning-in of finer pitch and area array I/O's need be developed.

One approach to reducing the drawbacks of the typical manufacturing process has been to increase the scope of the wafer level test to include the more vigorous functional and burn-in tests as are done on the singulated packaged die. In order to facilitate the fully functional and burn-in testing, it is necessary to interconnect all or almost all of the I/O pads of the die to the device tester. Wire probe cards are used to access all the I/O pads of the die at the singulated die level but are limited by the pitch between the I/O pads as well as being limited to peripheral pads. These constraints eliminate the use of wire probe cards from contacting more than one die at a time, thus all the die of an entire wafer cannot be fully tested and burn-in tested at the same time.

Another approach has been to use a polyimid based membrane to access the I/O pads of the die. The polyimid based cards suffer from a wasting of tester resources unless wafer yields are close to 100%. Since the die are being tested before being separated from the wafer some faulty die take up a portion of the tester time. For example if a wafer contained one hundred die, all one hundred would be interconnected to the device tester and tested at the same time. If twenty of the die were defective, the failing die could not be removed from the testing procedure until the entire wafer had completed it's testing. In this manner one fifth of the available tester time is wasted on defective die.

SUMMARY OF THE INVENTION

In accordance with the present invention a singulated die test socket comprised of a wafer of semiconductor material having at least one cavity or recess disposed therein, each of the cavity or recesses having a base portion through which a plurality of test tips are disposed therein; the wafer also having a plurality of external I/O pads selectively connected to the test tips.

The socket is comprised of a wafer of semiconductor material having one or more cavities. Each cavity has a plurality of test tips in its base. The test tips provide electrical connections to a plurality of external I/O pads. The I/O pads interconnect the socket to a test station. The socket cavity may be produced using a wet etch process which results in the cavity having sloping sidewalls. The sloping sidewalls provide for self alignment of the die within the socket. Self alignment of the die within the cavity eliminates the need for external mechanical or optical alignment.

Previous methods of die testing have suffered from the die having to be packaged before burnin testing could be performed. By using the singulated die test socket the die can be burnin tested before packaging, therefore no faulty die will be packaged. Because the socket is comprised of semiconductor material it has the same thermal coefficients of expansion as the die being tested, therefore there is little movement of the die relative to the socket. In this manner the die can be thermally stressed before being packaged.

The socket can further be used as an integrated circuit package. The package is produced in the same manner as the socket. The die is attached to a lid with the I/O pads of the die facing away from the lid. A compliant adhesive is applied to the top of the package outside the cavity area. The die is then inserted into the cavity, permitting the I/O pads of the die to mate with the test tips via the self alignment feature of the cavity. The assembly is pressed together and the adhesive allowed to cure.

Current integrated circuit packages require securing the die within the package, wire bonding between the pads on the die to the pads of the package to create the interconnect between the die and package and then sealing the package by soldering, brazing, or epoxying a lid in place. Such a process is expensive, time consuming and has ample opportunity for the introduction of assembly flaws. Use of the singulated die test socket as a package is less costly, requires less equipment and reduces the possible introduction of assembly flaws.

BRIEF DESCRIPTION OF THE DRAWINGS

FIGS. 3A to 3G are cross-sectional views of a wafer showing steps in the fabrication of a test socket of FIGS. 1 and 2;

DESCRIPTION OF THE PREFERRED EMBODIMENTS

Figure 1:
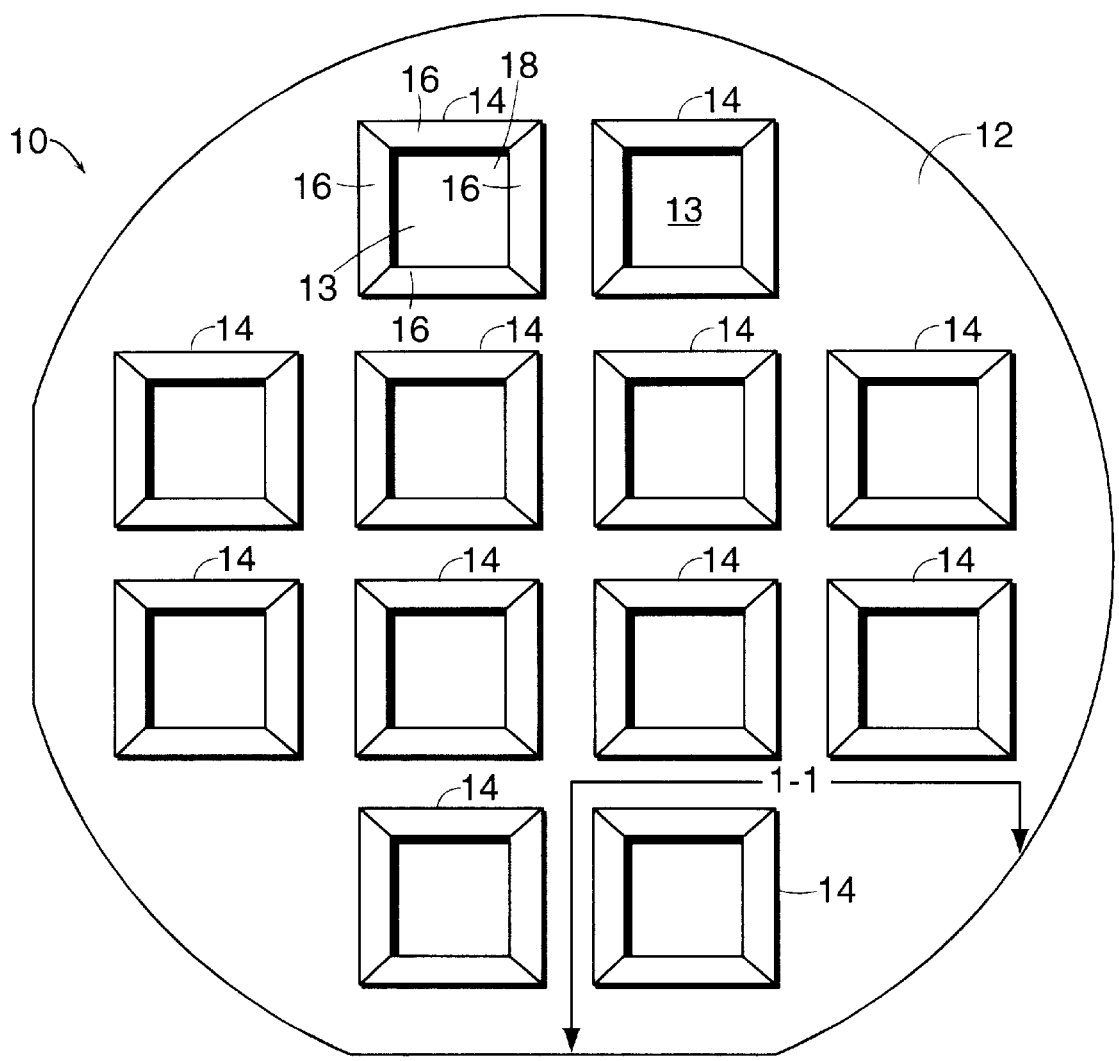
FIG. 1 is a top view of a singulated die test socket.

Referring now to FIG. 1, a simple singulated die test socket 10 is shown having a plurality of here twelve socket cavities or recesses 14 disposed in wafer 12. In practice many more than twelve socket cavities would be provided. Each socket cavity 14 has four sloping or beveled sidewalls 16. The sidewalls 16 slope inwards or towards a center of the base portion 13 of the cavity 14 such that the opening 10 of the recess 14 is larger than the base 13. Here wafer or base 12 is comprised of silicon or other semiconductor type material similar to the material used to produce the die to be tested. The use of a similar semiconductor type material for the socket as is used for the die results in a matching of the thermal coefficients of expansion between the socket and the die. Therefore there is minimal relative movement between the die and the socket during thermal changes introduced during testing of semiconductor die. The singulated die test socket 10 is fabricated using standard semiconductor photolithography, masking and etching techniques. The cavities 14 are produced using a wet etching process in order to produce four sloped sidewalls 16 which are used for aligning the die within the cavity 14. The cavity further includes a base 18, and test tips (not shown) which are disposed in the base 18.

Figure 2:
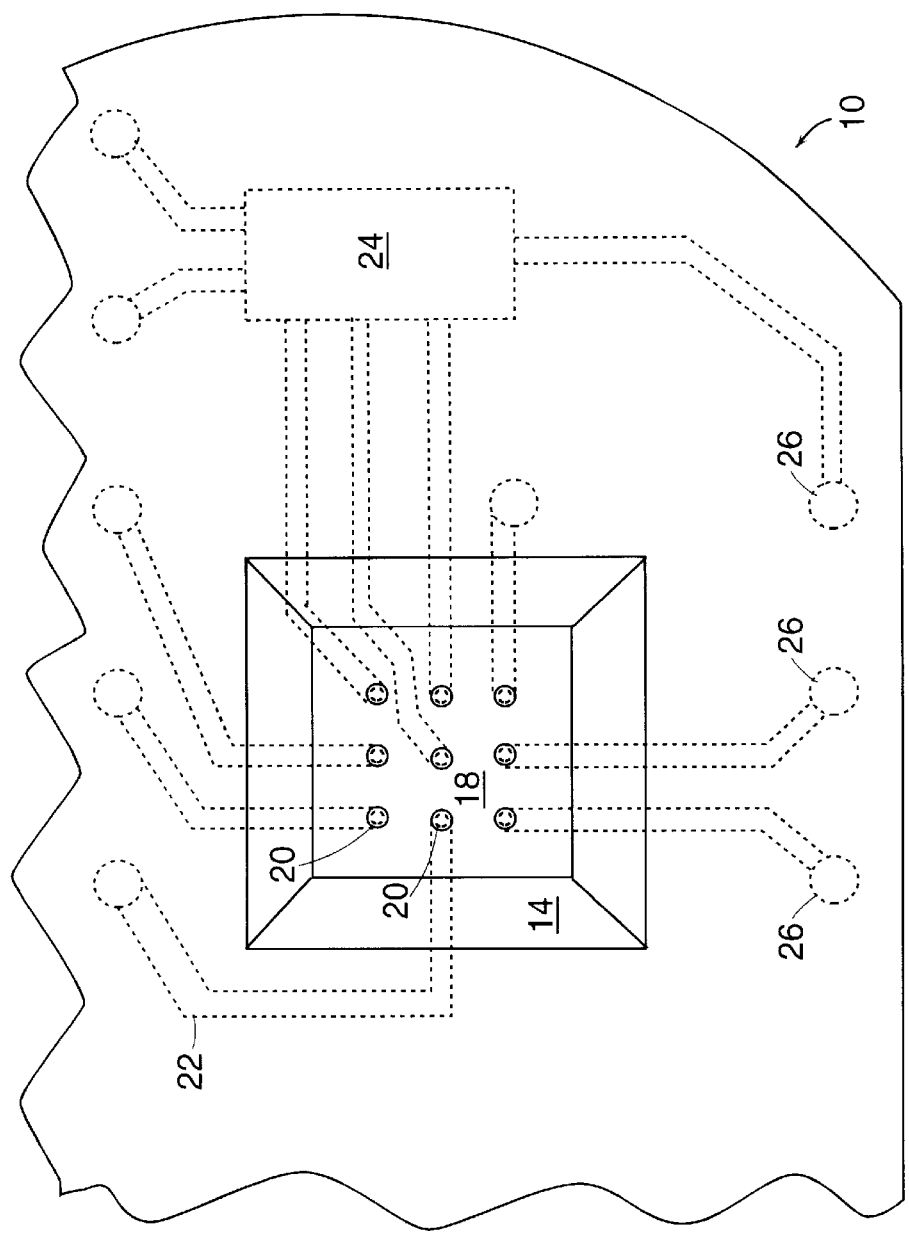
FIG. 2 is a broken away view of a single socket cavity of the singulated die test socket taken along line 1—1 of FIG. 1.

Referring now to FIG. 2, the cavity 14 has a plurality of test tips 20 disposed along the base 18 of the cavity 14. A plurality of the test tips 20 are electrically connected to external I/O pads 26 via electrical conductors 22 disposed throughout the wafer 10. A plurality of the test tips 20 are also shown connected to circuitry 24 such as buffers, drivers, RAMS and ROMS which are used to supplement the test performance of the socket.

Figure 3E:
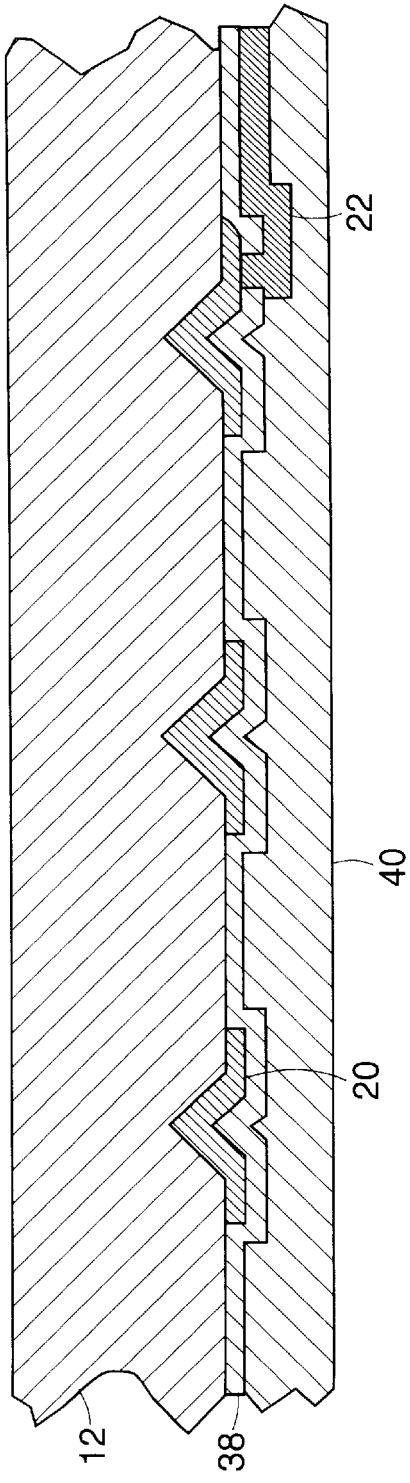

Referring now to FIG. 3A–3H a portion of the singulated die test socket is shown in various stages of fabrication. FIG. 3A shows a substrate 12 here comprised of single crystal silicon, after etching portions thereof to provide recesses 34 within a surface 12a thereof. Here three test tip recesses 34 are shown etched into the base silicon 12. The etching can be performed by use of a wet etch isotropic etchant such as potassium hydroxide (KOH) or tetra methyl ammonia hydroxide (TMAH) to remove unmasked portions of the base 12. As shown in FIG. 3B the wafer has been selectively plated to provide an electrical contact surface 20 over a portion of surface 12a and within recesses 34 providing test tips 20. Here, the test tips 20 have been produced by plating the test tip recesses 34 with iridium via a vapor deposition process or similar process. Other metals which can be used include rhodium as well as other refractory type metals. Additionally multilayer films such as iridium/copper, tin-lead/copper or iridium/aluminum may be used. FIG. 3C shows the wafer after a layer of dielectric material 38 here silicon nitride has been deposited over the surface 12a and test tips 20 using conventional techniques. The dielectric is patterned to provide an aperture 38' to expose a portion of test tips 20 as shown. Aperture 38' is produced by selective etching of dielectric layer 38, with the produced aperture defining areas of interconnect between test tips 20 and conductors.

Figure 3F:
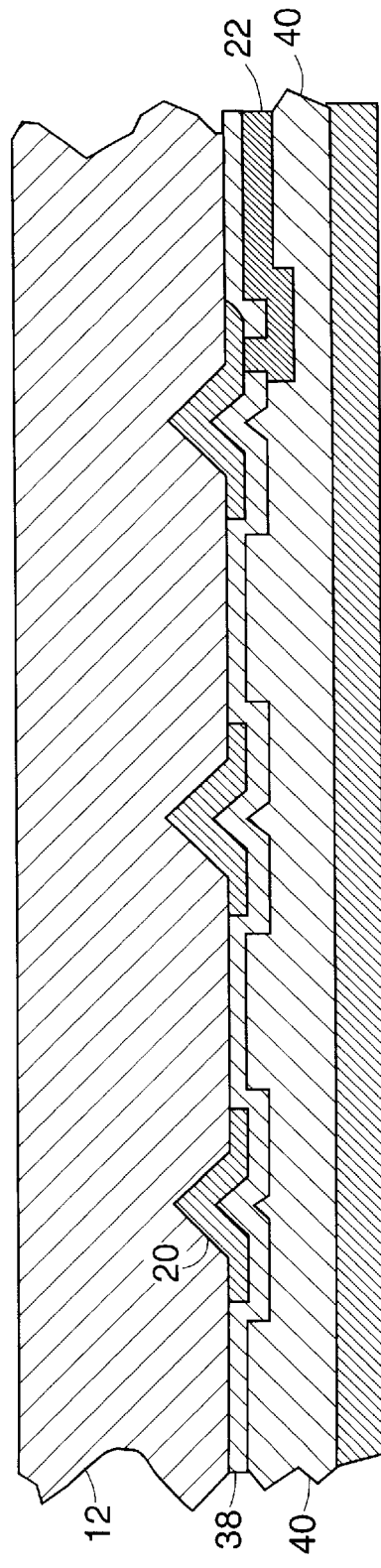

FIG. 3D shows the wafer of FIG. 3C after a metalization layer (not shown) has been deposited over the dielectric layer 38. The metallization layer, here aluminum, is selectively patterned using conventional etching techniques to provide a conductor 22 connected to one of the test tips 20. The conductor 22 is used to electrically interconnect the test tip 20 with either an I/O pad (not shown) or additional circuitry (not shown). FIGS. 3E and 3F show additional layers of alternating dielectric 40 and metalization 42. Depending on the complexity and pin count of the device being tested there may be multiple layers of dielectric and metalization. These additional layers may be necessary in order to interconnect all or almost all of the pads of the device being tested to the tester. Additionally a metallization layer 42 may be used to provide power or ground planes.

Figure 3G:
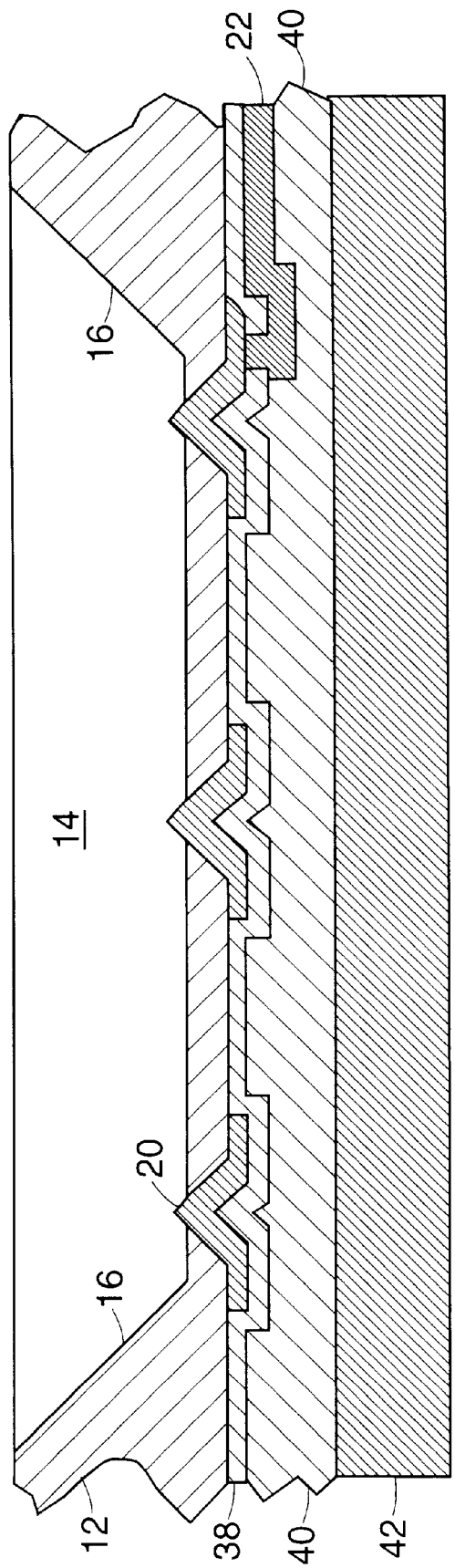

Referring now to FIG. 3G the base silicon 12 is shown after a cavity 14 has been provided through portions of the substrate 12, exposing test tips 20. The cavity 14 here has been produced by exposing selective unmasked portions of the base to an isotropic etchant such as tetra methyl ammonia hydroxide (TMAH) or potassium hydroxide (KOH). By using a wet etch process the silicon is removed isotropically and the cavity is produced having sloping sidewalls 16. The sloping sidewalls 16 are used to self align the die within the socket. In this manner no external mechanical or optical means are necessary to align the die within the socket. The cavity is etched deep enough to expose the test tips 20. With a socket produced in this manner it is possible to fully test the die before the die are packaged.

Figure 4:
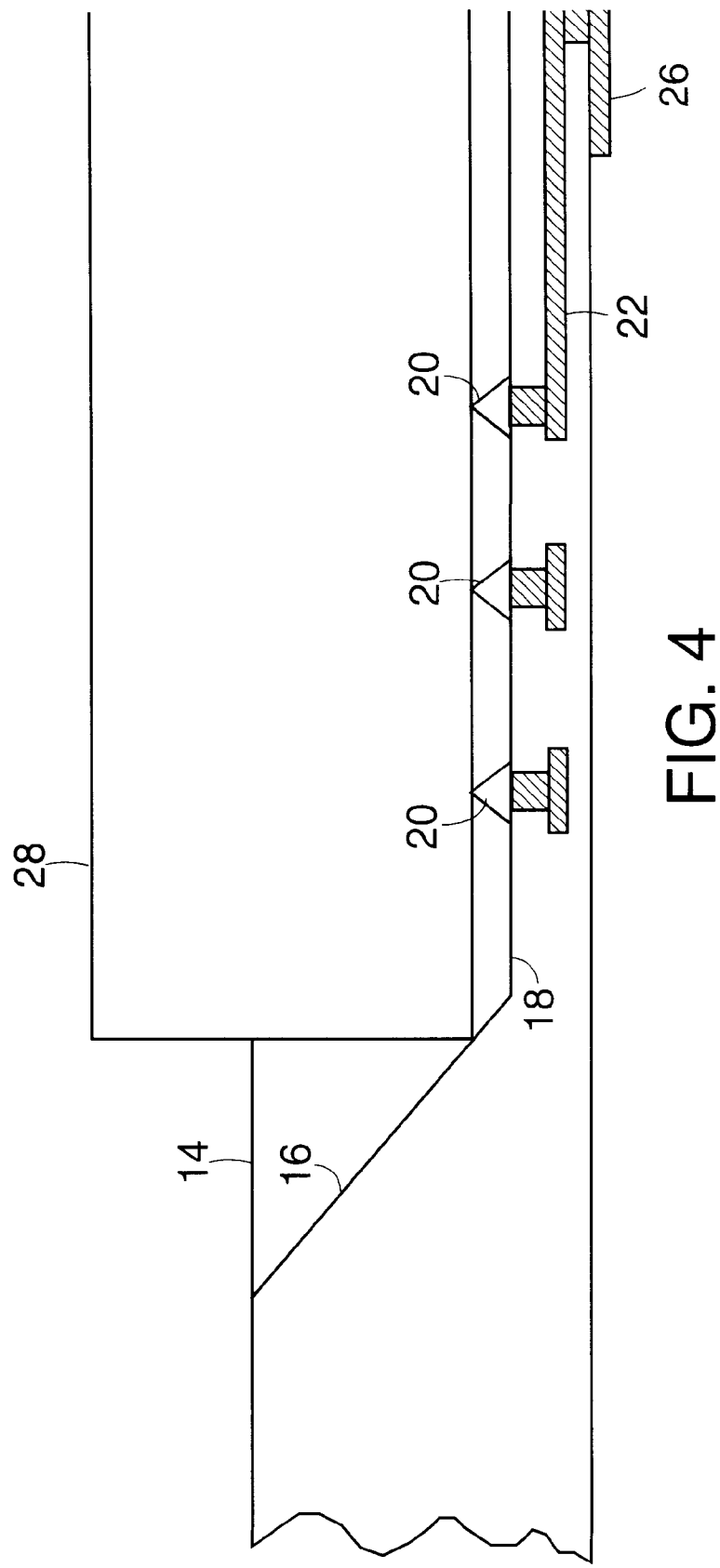
FIG. 4 is a cross sectional view of the socket cavity of FIG. 2 taken along line 4—4 showing test tips contacting a die.

Referring now to FIG. 4, a die 28 is shown seated in a cavity 14 of the singulated die test socket 10. The aluminum I/O pads (not shown) of die 28 are electrically connected to test tips 20 at the base 18 of the multi-site test socket 10. The test tips 20 here are comprised of iridium and are attached to conductors 22 dispersed throughout the wafer 10. The conductors 22 provide for electrical connections from the test tips 20 to I/O pads 26 of the singulated die test socket 10. The I/O pads 26 connect to a device tester. In this manner the device tester can exercise all or almost all of the I/O pads of the die 28.

The singulated die test socket enhances the ability to test a die prior to packaging. It is also desirable to produce multiple singulated die test sockets on a single wafer and use the multiple sockets on a test station. Since the socket is formed using the same technology as the die, it is possible to fabricate circuitry into the socket wafer which will supplement the test performance. Power and ground planes can be added as well as capacitors, resistors and similar devices to aid in the signal integrity of the socket. Additionally devices such as buffers, drivers, Random Access Memories (RAMs) and Read Only Memories (ROMS) can also be fabricated as part of the wafer containing the sockets.

Figure 5:
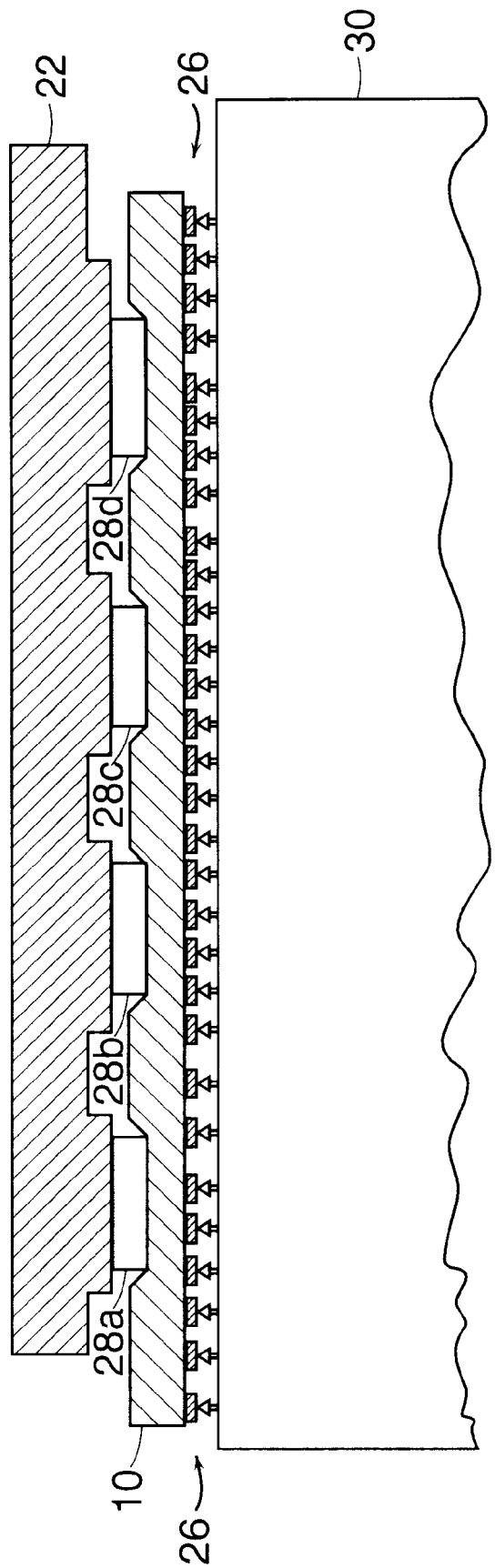
FIG. 5 is a cross-sectional view of the singulated die test socket of FIG. 1 installed on a test station.

Referring now to FIG. 5 four die 28a, 28b, 28c and 28d are shown residing in respective cavities 14 of the singulated die test socket 10. The die 28a, 28b, 28c and 28d are interfaced to the pins of the test station 30 via the test tips (not shown) and conductors (not shown) resident in the silicon base of the singulated die test socket 10. Also shown is a die heater 22 which allows for die 28a, 28b, 28c and 28d to be brought up to the die's high temperature limit. In this manner die 28A, 28B, 28C and 28D can be burned-in by being exercised at various temperatures, thus ensuring that die 28a, 28b, 28c and 28d are fully functional. Because the singulated die test socket 10 is comprised of the same material as die 28A, 28B, 28C and 28D, the socket 10 has the same thermal coefficients of expansion, therefore there is minimal relative movement of die 28A, 28B, 28C and 28D within the socket 14 during thermal testing.

Figure 6:
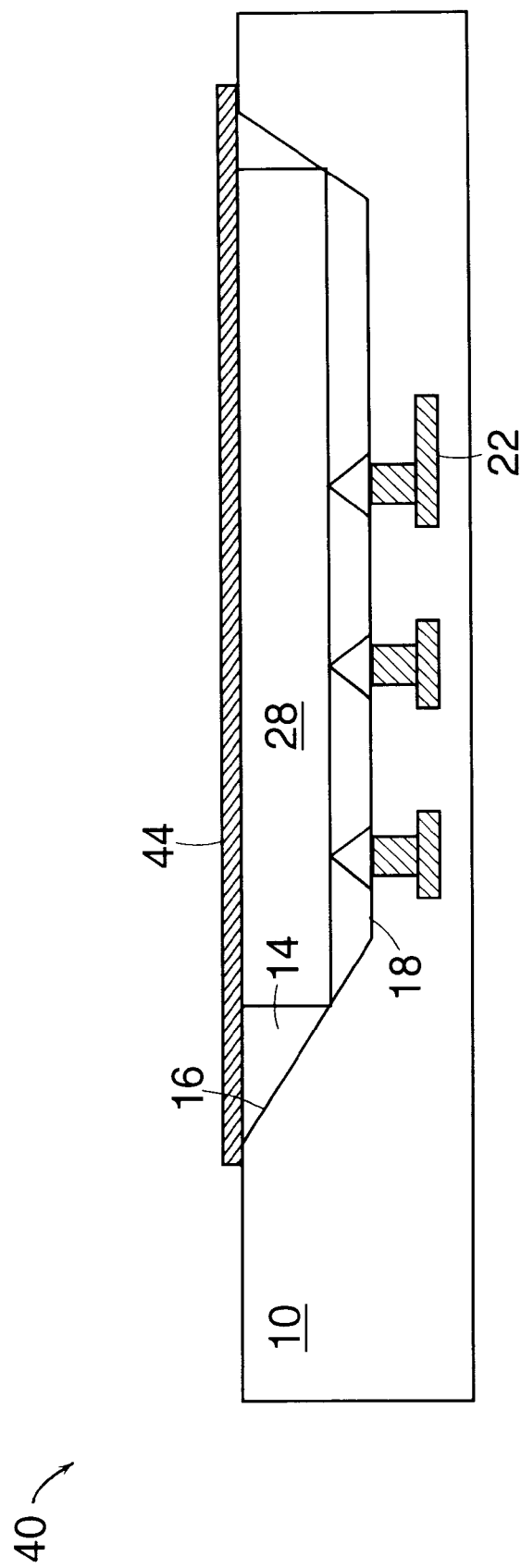
FIG. 6 is a cross-sectional view of a singulated die test socket used as an integrated circuit package.

Referring now to FIG. 6, a singulated die test socket 40 is shown to include wafer 10 and a die 28 which is attached to a lid 44. The lid 44 and die 28 are inserted in to cavity 14 in the package 40. The I/O pads (not numbered or shown) of die 28 are mated with test tips 20 via the self alignment provided by sloping sidewalls 16 of the cavity 14. An adhesive or other type of bond (not shown) is used to bond the lid 44 to the surface 10a of wafer 10.

The socket is a semiconductor like device fabricated in a similar manner as the die, with the cavity of the socket formed by etching of the silicon to provide a cavity having sloping sidewalls. In this manner there is no need for the larger pad sizes required by other techniques such as the polyimid membrane with an aluminum substrate which suffers from different coefficients of expansion and therefore requires larger pad sizes to accommodate the motion of different expansion rates and thus restricts the minimum pitch of the device.

The socket is produced using photolithography, masking and etching technologies that are used in the design and fabrication of semiconductor die. Etching of the wafer 10 to provide cavities 14 leaves a thin silicon membrane as a base portion of the cavity. The membrane has dielectric and metalization layers built over a surface thereof. A natural result of a wet etch process is a 54.7 degree slope in the silicon side walls of the cavity. This slope produced by the wet etch process is used as a self-aligning feature for alignment of the die within the socket cavity. Wet etching is typically performed by using tetra methyl ammonia hydroxide (TMAH) or potassium hydroxide (KOH). Wet etching with either TMAH or KOH produces the cavity with the desired sloping sidewall. The socket cavity may also be produced by a dry etch process. An example of such a dry etching technique is reactive ion etching (RIE). RIE results in a side wall that is generally perpendicular to the base of the cavity.

During use of the singulated die test socket, once a wafer of semiconductor devices is produced, all the die are separated from the wafer. The singulated die are then automatically placed into the singulated die test sockets by a pick and place machine. A quick screen test is run to identify bad die, which are replaced with more fresh die. A fully functional test and burn-in is then performed on all the die, the result being that the die are tested without the need to have them assembled into packages.

Usually the most expensive element in the test process is the tester time, which is reduced by using this type of socket and test process. Since faulty die can be removed immediately wasted tester time is reduced to a minimum. Additionally since the die are tested prior to packaging, die which fail test or burn-in will not be packaged, thereby saving the cost of packaging faulty die. Also test results will be available earlier, permitting more timely feedback to the wafer fabrication process for improving yield.

In such a manner the singulated die can be rigorously exercised before being packaged resulting in the saving of tester time and the saving of money by not having packaged faulty die.

Having described preferred embodiments of the invention it will now become apparent to those of ordinary skill in the art that other embodiments incorporating these concepts may be used. Accordingly it is submitted that the invention should not be limited to the described embodiments but rather should be limited only by the spirit and scope of the appended claims.

What is claimed is:

1. A socket for testing unpackaged singulated die having centrally distributed I/O pads comprising:
    a continuous substrate comprised of a semiconductor material having a similar thermal coefficient of expansion as the semiconductor material of singulated dies to be tested, the substrate having a recess formed on one side thereof sized to receive singulated dies to be tested, such recess having a base surface with a fixed position on the substrate, the recess having sidewalls sloping laterally outwardly away from the base surface such that the sidewalls guide a die placed in the recess for testing in alignment position with the base surface of the recess;
    test tips on the substrate distributed within the central portion of the recess, such test tips extending away from the base surface to engage the I/O pads on the die placed in the recess for testing;
    I/O testing pads on the exterior of the substrate; and
    electrical conductors located within the substrate, such electrical conductors connecting individual I/O testing pads with individual test tips.

2. The socket of claim 1 wherein the test tips comprise refractory metal.

3. The socket of claim 2 wherein said refractory metal is iridium.

\* \* \* \* \*